United States Patent [19]

Chiba et al.

[11] Patent Number: 5,057,286
[45] Date of Patent: Oct. 15, 1991

[54] VESSEL FOR USE IN HYDROTHERMAL SYNTHESIS

[75] Inventors: Kotaro Chiba; Motohide Hatanaka; Masayuki Kawai, all of Hokkaido, Japan

[73] Assignee: The Japan Steel Works, Ltd., Tokyo, Japan

[21] Appl. No.: 474,903

[22] Filed: Feb. 5, 1990

[51] Int. Cl.$^5$ .............................................. C30B 7/10
[52] U.S. Cl. ..................................... 422/245; 422/248; 422/113; 422/242; 156/623 R; 156/DIG. 98
[58] Field of Search ....... 156/623 R, 623 Q, DIG. 98; 422/245, 248, 113, 242

[56] References Cited

U.S. PATENT DOCUMENTS

| | | | |
|---|---|---|---|
| 2,990,256 | 6/1961 | Lovins | 156/623 R |
| 3,230,051 | 1/1966 | Sampson | 156/623 R |
| 3,271,114 | 9/1966 | Kolb | 156/623 R |
| 3,646,320 | 2/1972 | Rosatelli et al. | 156/623 R |
| 4,326,891 | 4/1982 | Sadler | 106/699 |
| 4,395,388 | 7/1983 | Kaduk | 501/4 |
| 4,762,588 | 8/1988 | Hirano et al. | 156/623 R |
| 4,795,623 | 1/1989 | Evans | 423/329 |
| 4,798,717 | 1/1989 | Morency | 423/335 |

FOREIGN PATENT DOCUMENTS 838575   6/1960   United Kingdom ............ 156/623 R

OTHER PUBLICATIONS

Lobachev, "Crystallization Processes Under Hydrothermal Conditions", Consultants Bureau, New York, 1973.

Primary Examiner—Robert Kunemund
Attorney, Agent, or Firm—Sughrue, Mion, Zinn, Macpeak & Seas

[57] ABSTRACT

A vessel for use in hydrothermal synthesis, comprises: a vessel body to be heated from outside; an inner tubular vessel which is placed within the vessel body with a tubular gap being formed therebetween, the inner tubular vessel having an inner surface which is formed of a precious metal such as silver, gold or platinum, and having a cover with a first small hole therein; and a buffer compartment for covering the first small hole, the buffer compartment having one wall which is defined by the cover and having the other wall with a second small hole therein.

9 Claims, 2 Drawing Sheets

VESSEL FOR USE IN HYDROTHERMAL SYNTHESIS

BACKGROUND OF THE INVENTION

1. Field of the Invention

The present invention relates to a vessel for use in hydrothermal syntheses such as one involved in the production of artificial rock crystals.

2. Prior Art

A vessel conventionally used in hydrothermal syntheses is shown in FIG. 4 and consists generally of a vessel body 21, a cover 22, clamps 23, a convection control plate 24, a heater 25 and thermocouples 26. Seeds A and a feed material B in the vessel body 21 are submerged in a strong alkali solution heated with the heater 25. To take the hydrothermal synthesis of artificial rock crystals as an example, the vessel is used at temperatures of 350-400° C. and at pressures of 1,000-1,500 kg/cm$^2$, so the vessel body 21 must be made of metallic materials that have high strength, toughness and corrosion resistance.

Many of the articles produced by hydrothermal syntheses are intended to be used in such applications as electronics and optics where there is a growing demand for reduction in both size and thickness. When a small and thin strip is to be produced by hydrothermal synthesis, a major cause of deterioration of the product is contamination by foreign substances. A particularly pronounced problem is that the inner surface of the vessel body 21 is corroded by a strong alkali solution to produce an iron compound called "acmite" and that the product is contaminated by Fe+ ions. Various methods have been employed to solve this problem and one of them is to isolate the surface of seeds A. However, this method is not completely satisfactory and the growth of rock crystal is impeded at the protected seed surface to reduce the production rate.

Another approach is to prevent the generation of Fe+ ions per se by either coating the inner surface of the vessel body 21 with a precious metal such as silver, gold or platinum or placing an inner tubular vessel made of these precious metals within the vessel body 21. In the first case where the inner surface of vessel body 21 is coated with a precious metal such as silver, gold or platinum, the adhesion between the precious metal coat and the inner surface of vessel body 21 must be insured by such means as hydraulic expansion of the tubular body or explosive bonding but this involves considerable difficulty in manufacturing the vessel. Further, depending on the construction of vessel body 21, inadequate maintenance of the sheet surface in the sealed area might occur. In the second case where an inner tubular vessel made of a precious metal such as silver, gold or platinum is placed within the vessel body 21, the pressure within inner tubular vessel must be made equal to that working outside so that undue external pressure will not act on this inner vessel. To this end, it is essential that the volume of fluid within the inner vessel be held equal to that outside of the vessel. For these reasons, the two methods described above which are intended to prevent the generation of Fe+ ions have been applicable only to small experimental vessels.

SUMMARY OF THE INVENTION

Under these circumstances, it is the principal object of the present invention to provide a vessel for use in hydrothermal synthesis that is large and suitable for industrial operations. According to its first aspect, the present invention provides a vessel for use in hydrothermal synthesis that comprises a tubular vessel that is placed within said vessel body with a tubular gap being formed therebetween and at least the inner surface of which is formed of a precious metal such as silver, gold or platinum, with a small hole being made in the cover of said inner tubular vessel, and a buffer compartment that covers said small hole, one surface of said buffer compartment being defined by said cover and with a small hole being also made in one of the other wall surfaces of said buffer compartment.

According to the second aspect of the present invention, the space of the buffer compartment in the vessel described above, the actual space of the tubular gap and the actual space of the inner tubular vessel are filled with an alkali solution in specified proportions, and the concentration of the alkali solution in the buffer compartment and the tubular gap is set to be lower than that of alkali solution in the inner tubular vessel.

In each of the two aspects described above, the tubular gap between the vessel body and the inner tubular vessel may be filled with a gas-permeable material having good heat conductivity.

DETAILED DESCRIPTION OF THE PREFERRED EMBODIMENTS

The inner tubular vessel of the present invention is charged with seeds and a feed material and the vessel body is heated from outside to perform a hydrothermal synthesis. At least the inner surface of the inner tubular vessel is formed of a precious metal, so Fe+ ions that are deleterious to the seeds will not be generated in the vessel body during the hydrothermal synthesis.

The tubular gap between the vessel body and the inner tubular vessel communicates with the interior of the latter by way of small holes made in its cover and in a wall surface of the buffer compartment, so the pressure within the inner tubular vessel equilibrates with the pressure outside to insure that no undue external pressure will act on the inner tubular vessel. Consequently, there is no possibility that the inner tubular vessel will be deformed or damaged.

If the space of the buffer compartment, the actual space of the tubular gap and the actual space of the inner tubular vessel are filled with an alkali solution in specified proportions and if the concentration of the alkali solution in the buffer compartment and the tubular gap is set to be lower than that of the alkali solution in the inner tubular vessel, the pressure in the tubular gap is substantially at equilibrium with the pressure in the inner tubular vessel. Any change in pressure will be absorbed by the small holes in the cover of the inner tubular vessel and in a wall surface of the buffer compartment and the balance between the pressure in the tubular gap and that in the inner tubular vessel is restored.

If the pressure in the tubular gap rises, a small amount of alkali solution containing Fe+ ions will enter the buffer compartment through the small hole in its wall surface but then it mixes with the alkali solution in the buffer compartment and the Fe+ ions in this alkali solution are diluted before they enter the inner tubular vessel. The diluted alkali solution will cause only minimum effects on the seeds in the inner tubular vessel. In addition, the concentration of the alkali solution in the tubular gap is low enough to avoid corrosion of the inner surface of the vessel body. This effect, combined with reduced generation of Fe+ ions, contributes to a further decrease in the deleterious effects on the seeds in the inner tubular vessel.

If the tubular gap is filled with a gas-permeable material having good heat conductivity, not only is the heat transfer from the vessel body to the inner tubular vessel enhanced but also the pressure in the tubular gap equilibrates with the pressure outside.

Figure 1:
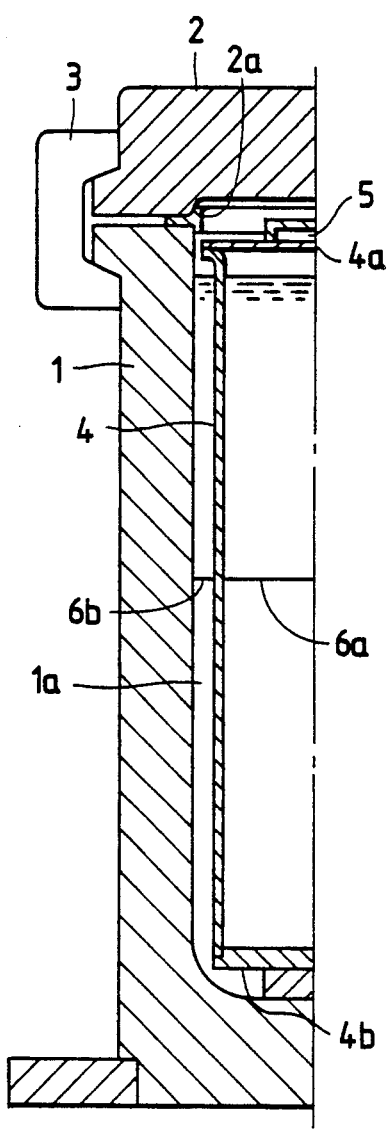
FIG. 1 is a cross-sectional view showing a half of a vessel for use in hydrothermal synthesis according to an embodiment of the present invention.

Embodiments of the present invention are described below with references to FIGS. 1 to 3. FIG. 1 is a cross-sectional view showing a half of a vessel for use in hydrothermal synthesis according to an embodiment of the present invention. The vessel comprises the following main components: a vessel body 1 to be heated from outside which is made of a metallic material having high strength, toughness and corrosion resistance; a body cover 2 that is detachably mounted on the vessel body 1 by means of a plurality of clamps 3 via a packing 2a; and bottomed inner tubular vessel 4 made either of a precious metal such as silver, gold or platinum or of a non-precious metal such as titanium (Ti) clad with a precious metal on its inner surface. This inner tubular vessel has a detachable cover 4a and bottom plate 4b which are made of the same material as that of this inner tubular vessel. A small hole 4a' is made in substantially the central portion of the cover 4a as shown specifically in FIG. 2. The small hole 4a' has such a size that in the absence of any pressure acting on it, a fluid will not flow down under its own weight on account of its surface tension. As a guide, the hole may have a diameter of about 0.4 mm. A buffer compartment 5 is formed by securing a box-shaped member 5a to the upper surface of the cover 4a of the inner tubular vessel in such a way that it covers the small hole 4a'. The top plate of the box-shaped member 5a is also provided with a small hole 5b of a size of about 0.4 mm in diameter. The small hole 5b should be at a higher position than the level of fluid in the buffer compartment 5. At least the inner surface of the buffer compartment 5 is formed of a precious metal.

The inner tubular vessel 4 having the construction described above is placed in the vessel body 1 with a tubular gap 1a being provided between these two members.

The vessel shown in FIG. 1 also has two convection control plates 6a and 6b. Plate 6a is provided within the inner tubular vessel 4 and plate 6b is provided in the tubular gap 1a between the inner tubular vessel 4 and the vessel body 1. Seeds are placed within the inner tubular vessel 4 above the convection control plate 6a, and a feed material is placed below this control plate. The space of the buffer compartment 5, the actual space of the tubular gap 1a between the vessel body 1 and the inner tubular vessel 4, and the actual space of the inner tubular vessel 4 are filled with an alkali solution in specified portions, and the concentration of the alkali solution in the buffer compartment 5 and the tubular gap 1a is set to be lower than that of the alkali solution in the inner tubular vessel 4.

Being set under the condition described above, the vessel body 1 is heated from outside to initiate a hydrothermal synthesis.

The operation with the vessel of the present invention will proceeds as follows. The buffer compartment 5 communicates with the tubular gap 1a via small hole 5b and with the interior of the inner tubular vessel 4 via small hole 4a'. Accordingly, if the pressure within the inner tubular vessel 4 becomes different from the pressure outside either because the proportions of the fluid in the tubular gap 1a and the inner tubular vessel 4 slightly deviate from the specified value or because heating causes a difference in temperature between the fluid in the tubular gap 1a and the fluid in the inner vessel 4, the alkali solution in the buffer compartment 5 will move either into the inner tubular vessel 4 or into the tubular gap 1a to restore equilibrium between the pressure within the inner tubular vessel 4 and the pressure outside.

Further, the Fe+ ion containing alkali solution in the tubular gap 1a will mix the alkali solution in the buffer compartment 5 before it enters the inner tubular vessel 4. Hence, the Fe+ ions in the alkali solution admitted into the inner tubular vessel 4 are sufficiently diluted to minimize possible deleterious effects on the quality of the final product.

The alkali solution in the tubular gap 1a is adjusted to have a lower concentration than that in the inner tubular vessel 4 and this is effective in reducing the corrosion of the vessel body 1 and hence the generation of Fe+ ions.

Figure 2:
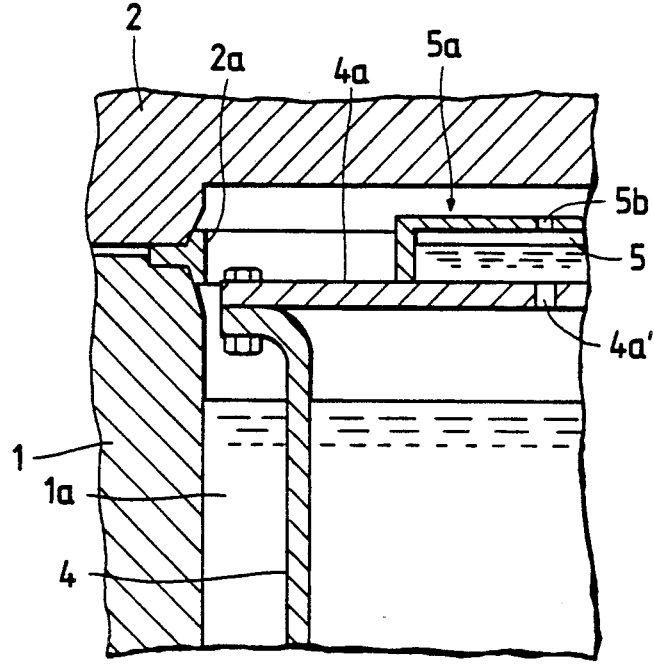
FIG. 2 is a cross-sectional view showing the essential part of the cover of the inner tubular vessel and the buffer compartment in the vessel shown in FIG. 1.
Figure 3:
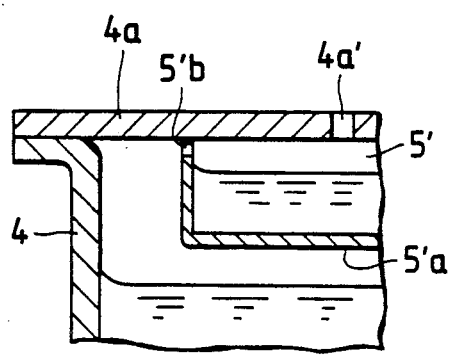
FIG. 3 is a cross-sectional view showing the essential part of the cover of the inner tubular and the buffer compartment in a modified design.
Figure 4:
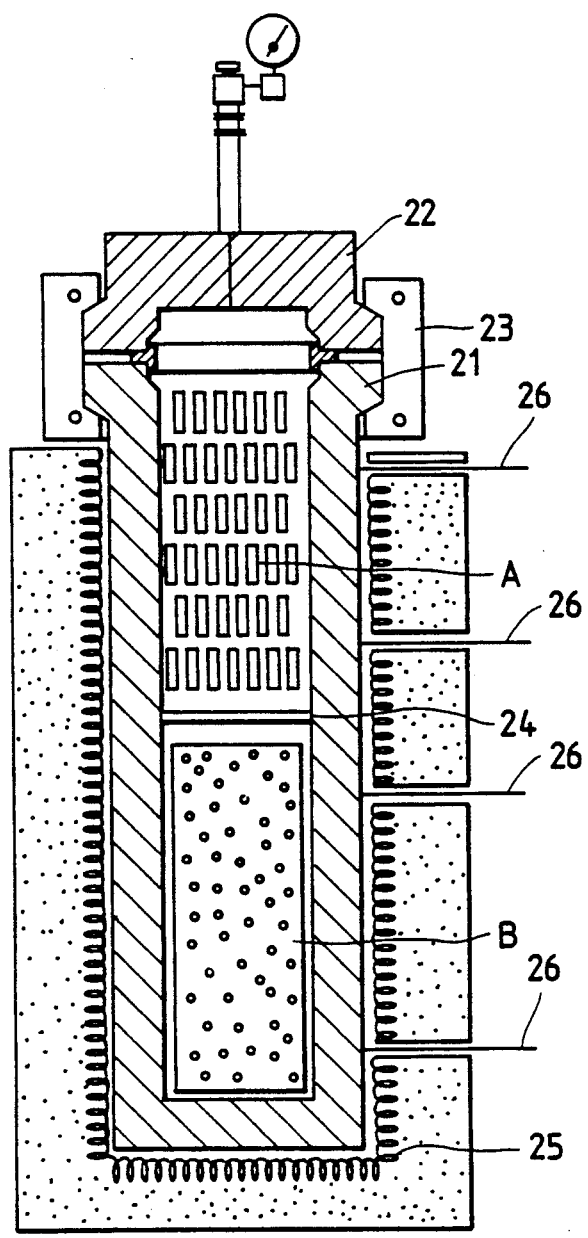
FIG. 4 is a cross-sectional view of a prior art vessel for use in hydrothermal synthesis.

FIG. 3 shows a buffer compartment 5' which has a different construction than that shown in FIG. 2. This buffer compartment is formed by securing a box-shaped member 5'a to the underside of the cover 4a of the inner tubular vessel in such a way that it covers the small hole 4a'. A small hole 5'b of a size of about 0.4 mm in diameter is also made in a side plate of the box-shaped member 5'a at a site above the surface of the fluid in the buffer compartment. This buffer compartment 5' is preferably made of a precious metal on both the inner and outer surfaces.

The Fe+ ion containing alkali solution which, flows into the buffer compartment 5' through the small hole 4a' will mix with the alkali solution in said buffer compartment and the Fe+ ions in that alkali solution will be sufficiently diluted before it enters the inner tubular vessel 4. Thus, the buffer compartment 5' will provide substantially the same effect as the buffer compartment 5.

It is desirable to accomplish efficient heat transfer from the vessel body 1 to the inner tubular vessel 4. Therefore, if the tubular gap 1a is so wide as to preclude efficient heat transfer, the tubular gap 1a is preferably filled with a material such as a metallic nickel (Ni) foam that has good heat conductivity, that is gap-permeable and that has high thermal expansion ratio. High gas permeability is required in order to provide uniformity in the pressure in the tubular gap 1a. High thermal expansion ratio is required in order to insure that good adhesion to both the inner surface of the vessel body 1 and the outer surface of the inner tubular vessel 4 is attained as the temperature increases.

As will be understood from the foregoing explanation, the vessel of the present invention has the following advantages.

(1) With this vessel, Fe+ ions will not be generated from the inner tubular vessel having seeds placed in it.

(2) The wall of the inner tubular vessel is fairly thin but the pressure within this inner tubular vessel can be held in equilibrium with the pressure outside so as to insure consistent operations without causing deformation or damage of the inner tubular vessel.

(3) When the vessel body is corroded by an alkali solution, Fe+ ions will be generated. However, if the pressure outside the inner tubular vessel rises, the alkali solution will flow into the inner tubular vessel after the Fe+ ions are adequately diluted with the alkali solution in the buffer compartment. Hence, the Fe+ ions will cause only slight effects on the seeds in the inner tubular vessel.

(4) The alkali solution in contact with the vessel body is so low in concentration that its corrosive action on the vessel body is small enough to reduce the generation of Fe+ ions.

Having these advantages, the vessel of the present invention enables rock crystals and other products of good quality to be produced by hydrothermal syntheses.

What is claimed is:

1. A vessel for use in hydrothermal synthesis, comprising:
    a vessel body to be heated from outside;
    an inner tubular vessel which is placed within said vessel body with a tubular gap being formed therebetween, said inner tubular vessel having an inner surface which is formed of a precious metal such as silver, gold or platinum, and having a cover with a first small hole therein; and
    a buffer compartment for covering said first small hole, said buffer compartment having one wall which is defined by said cover and having the other wall with a second small hole therein, wherein said tubular gap communicates with an interior of said inner tubular vessel via said first and second small holes so that a pressure within said inner tubular vessel equilibrates with a pressure in the tubular gap.

2. A vessel as claimed in claim 1, wherein the space of said buffer compartment, the actual space of said tubular gap and the actual space of said inner tubular vessel are filled with an alkali solution in specified proportions, respectively, and the concentration of the alkali solution in said buffer compartment and said tubular gap is set to be lower than that of the alkali solution in said inner tubular vessel.

3. A vessel as claimed in claim 1, wherein said tubular gap between said vessel body and said inner tubular vessel is filled with a gas-permeable material having good heat conductivity.

4. A vessel as claimed in claim 2, wherein said tubular gap between said vessel body and said inner tubular vessel is filled with a gas-permeable material having good heat conductivity.

5. A vessel as claimed in claim 1, wherein said buffer compartment is provided outside of said inner tubular vessel.

6. A vessel as claimed in claim 2, wherein said buffer compartment is provided inside of said inner tubular vessel.

7. A vessel as claimed in claim 2, wherein said second small hole is provided above the level of the alkali solution filled in said buffer compartment.

8. A vessel as claimed in claim 5, wherein said buffer compartment has an inner surface which is formed of a precious metal.

9. A vessel as claimed in claim 6, wherein said buffer compartment has outer and inner surface both being formed of a precious metal.

* * * * *